(12) United States Patent
Lin et al.

(10) Patent No.: US 6,777,336 B2
(45) Date of Patent: Aug. 17, 2004

(54) METHOD OF FORMING A SHALLOW TRENCH ISOLATION STRUCTURE

(75) Inventors: Keng-Chu Lin, Ping-Tung (TW); Chih-Ta Wu, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/134,950

(22) Filed: Apr. 29, 2002

(65) Prior Publication Data

US 2003/0203515 A1 Oct. 30, 2003

(51) Int. Cl.⁷ .............................................. H01L 21/302
(52) U.S. Cl. ...................... 438/691; 438/692; 438/243; 438/245; 438/239; 438/241; 438/296; 438/200
(58) Field of Search ................................ 438/691, 200, 438/257, 296, 243, 264, 149, 238, 245, 424, 624, 692, 239, 241, 260, 734, 268, 242, 719, 597, 393

(56) References Cited

U.S. PATENT DOCUMENTS 6,207,533 B1 * 3/2001 Gao ............................ 438/424

* cited by examiner

Primary Examiner—Matthew Smith
Assistant Examiner—Igwe U. Anya
(74) Attorney, Agent, or Firm—Tung & Associates

(57) ABSTRACT

A method for reducing preferential chemical mechanical polishing (CMP) of a silicon oxide filled shallow trench isolation (STI) feature during an STI formation process including providing a semiconductor wafer having a process surface including active areas for forming semiconductor devices thereon; forming a silicon oxynitride layer over the process surface for photolithographically patterning STI trenches around the active areas; photolithographically patterning STI trenches around the active areas for anisotropic etching; anisotropically etching the STI trenches extending through the silicon oxynitride layer into the semiconductor wafer; depositing a silicon oxide layer over the silicon oxynitride layer to include filling the STI trenches; and, performing a CMP process to remove the silicon oxide layer overlying the silicon oxynitride layer to reveal an upper surface of the silicon oxynitride layer.

14 Claims, 2 Drawing Sheets

METHOD OF FORMING A SHALLOW TRENCH ISOLATION STRUCTURE

FIELD OF THE INVENTION

This invention generally relates to semiconductor processing methods and more particularly to a method for forming shallow trench isolation structures.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily, or permanently, noise margin degradation, voltage shift and cross-talk.

Shallow trench isolation (STI), is a preferred electrical isolation technique especially for a semiconductor chip with high integration. STI structures can be made using a variety of methods including, for example, the Buried Oxide (BOX) isolation method for shallow trenches. The BOX method involves filling the trenches with a chemical vapor deposition (CVD) silicon oxide ($SiO_2$) which is then planarized by a plasma etched back process and/or a chemical mechanical polishing (CMP) process to yield a planar surface. The shallow trenches etched for the BOX process are anisotropically plasma etched into the substrate, for example, silicon, and are typically between about 0.3 and about 1.0 microns deep.

Shallow trench isolation features with trenches having submicrometer dimensions are effective in preventing latch-up and punch-through phenomena. Broadly speaking, conventional methods of producing a shallow trench isolation feature include: forming a hard mask, for example silicon nitride, over the targeted trench layer, for example including a PAD oxide layer, patterning a photoresist over the hard mask to define a trench feature, anisotropically etching the hard mask to form a patterned hard mask, and thereafter anisotropically etching the trench feature to form the shallow trench isolation feature. Subsequently, the photoresist is removed (e.g., stripped) and the shallow trench isolation feature is back-filled, with a dielectric material, for to example a CVD silicon oxide, also referred to as an STI oxide, followed by thermal treatment and planarization steps to remove excess materials remaining above the trench level.

One problem with prior art processes is the differing material removal rates in the CMP process used to remove excess STI oxide overlying a hard mask silicon nitride layer. In prior art processes, silicon nitride is typically used for the hard mask and acts as a polishing stop in the CMP process to remove excess overlying STI oxide. The silicon nitride is typically removed at a rate about 33 percent compared to that of the STI oxide in a typical CMP process. As a result, preferential polishing of the STI oxide filled STI trenches occurs leading to dishing over the STI trenches thereby compromising device performance.

For example, referring to FIG. 1A is shown a conceptual cross sectional view of a portion of an STI structure showing two adjacent STI trenches 12A and 12B following formation of a STI oxide layer, for example silicon oxide 18 to fill the STI trenches and to cover the hard mask silicon nitride layer 16. The hardmask layer silicon nitride layer 16 is typically formed by a low pressure chemical vapor deposition (LPCVD) process formed over a thermally grown silicon oxide layer (PAD oxide) 14 over semiconductor substrate 10, for example, silicon. Frequently, a reverse etching mask is used to remove a portion of the excess STI oxide layer 18 over active areas e.g., 18A prior to a CMP process to remove the STI oxide layer 18 overlying the silicon nitride layer 16 to define an STI feature. Referring to FIG. 1B, according to prior art processes however, during the CMP process, dishing or preferential polishing of the STI oxide takes place in the CMP process leading to recessed surfaces e.g., 12C, 12D, at the upper surface of the STI oxide filled STI feature.

Several approaches have been proposed to alleviate the CMP polishing induced defects such as dishing including inserting dummy polishing areas around the STI features designed to reduce the effect of dishing and adding an additional metal nitride overlayer to act as an additional polishing stop. These approaches, while having limited success, have the effect of increasing processing steps and therefore increase operating costs while reducing a throughput.

Therefore, there is a need in the semiconductor processing art to develop an improved method for forming shallow trench isolation features whereby CMP processing induced defects are avoided or reduced while improving a production throughput.

It is therefore an object of the invention to provide an improved method for forming shallow trench isolation features whereby CMP processing induced defects are avoided or reduced while improving a production throughput while overcoming other shortcomings of the prior art.

SUMMARY OF THE INVENTION

To achieve the foregoing and other objects, and in accordance with the purposes of the present invention, as embodied and broadly described herein, the present invention provides a method for reducing preferential chemical mechanical polishing (CMP) of a silicon oxide filled shallow trench isolation (STI) feature during an STI formation process.

In a first embodiment, the method includes providing a semiconductor wafer having a process surface including active areas for forming semiconductor devices thereon; forming a silicon oxynitride layer over the process surface for photolithographically patterning STI trenches around the active areas; photolithographically patterning STI trenches around the active areas for anisotropic etching; anisotropically etching the STI trenches extending through the silicon oxynitride layer into the semiconductor wafer; depositing a silicon oxide layer over the silicon oxynitride layer to include filling the STI trenches; and, performing a CMP process to remove the silicon oxide layer overlying the silicon oxynitride layer to reveal an upper surface of the silicon oxynitride layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The method of the present invention is explained with respect to processing steps included in forming a shallow trench isolation (STI) structure. It will be appreciated, however, that the method of the present invention may be advantageously applied to any semiconductor manufacturing processing step including the formation of hard mask or polishing stop layers where it would be advantageous to minimize dishing by minimizing a difference between material removal rates for hard mask or polishing stop layers and an insulating dielectric layer. The term 'active areas' as used herein refers to areas of the semiconductor process surface where electrically active areas are formed for operating a completed semiconductor device.

In a first embodiment of the invention, a hard mask layer of silicon oxynitride is provided over a semiconductor wafer process surface for forming shallow trench isolation (STI) to surround and active area such that a difference in a material removal rates between silicon oxynitride and an STI oxide is less than a difference in material removal rates between silicon nitride and an STI oxide in a subsequent CMP polishing step to define the STI feature.

Figure 1A:
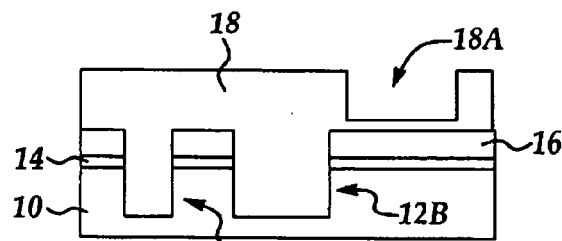
FIGS. 1A–1B are conceptual cross sectional views of a portion of a shallow trench isolation region showing manufacturing stages of shallow trench isolation features formed according to the prior art.
Figure 1B:
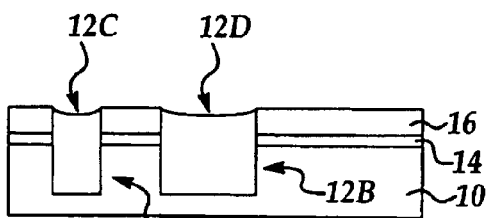
Figure 2A:
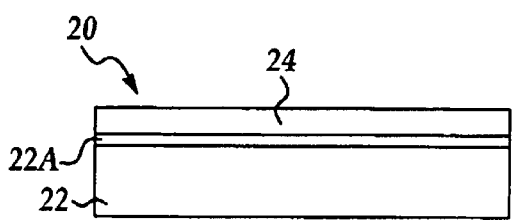
FIGS. 2A–2F are conceptual cross sectional views of a portion of a shallow trench isolation region showing manufacturing stages of shallow trench isolation features formed according to embodiments of the present invention.

For example, referring to FIG. 2A, is shown an exemplary cross sectional representation of a trench isolation region 20, having a substrate 22, for example, a silicon semiconductor wafer having a thermally grown PAD oxide 22A formed over the process surface. The PAD oxide layer 22A is preferably formed of silicon dioxide grown by a conventional thermal oxidation process to a thickness of between about 50 Angstroms and about 300 Angstroms.

Formed over the PAD oxide layer 22A is a silicon oxynitride hardmask layer 24 having a formula $SiO_xN_y$, where x and y represent respective stoichiometric proportions of oxygen and nitrogen. Preferably, the relative ratio of x to y may range from about 1:1 to about 1:4. For example, the silicon oxynitride is deposited according to a CVD process, for example, a low pressure CVD (LPCVD), plasma enhanced CVD (PECVD), or high density plasma CVD (HDP-CVD) process. Preferably, the silicon oxynitride is deposited by a CVD process formed by reacting $SiH_4$ and $N_2O$ gases as is known in the art. Preferably the silicon oxynitride hard mask layer is formed to have a thickness of between about 500 Angstroms and 3,000 Angstroms. A further advantageous aspect of the invention is that by forming the silicon oxynitride as the hardmask layer according to preferred embodiments of the present invention, the necessity of adding a silicon oxynitride anti-reflectance (ARC) coating layer is avoided. For example, an ARC layer of silicon oxynitride is frequently formed over a silicon nitride hard mask layer to reduce undesired reflections in a subsequent photolithographic step to pattern the hard mask for anisotropically etching the STI trenches.

In another embodiment of the invention, the silicon oxynitride is formed to have a CMP material within about 50 percent of the material removal rate of the STI oxide used to fill the STI trenches. More preferably, the silicon oxynitride is formed to have a CMP material removal rate within about 25 percent of the material removal rate of the STI oxide used to fill the STI trenches. Most preferably the silicon oxynitride is formed to have a CMP material removal rate about equal to the material removal rate of the STI oxide used to fill the STI trenches.

For example, it has been found that by adjusting the relative stoichiometric ratios of x and y in the formula $SiO_xN_y$, a material removal rate of the silicon oxynitride in a CMP process may be controllably adjusted. Preferably, the relative stoichiometric ratio of x:y is controllably adjusted between about 1:1 and about 1:4, more preferably between about 1:1.5 and about 1:3, most preferably about 1:2. For example, in one embodiment the relative stoichiometric ratios of x:y are preferably controllably adjusted varying the relative flow rates of the CVD precursor gases $SiH_4$:$N_2O$ from about 1:1 to about 1:4, more preferably between about 1:1.5 and about 1:3, most preferably about 1:2. In another embodiment, preferably the silicon oxynitride is formed to have a refractive index from about 1.9 to about 2.3, more preferably about 2.1 to about 2.2. In a further aspect of the invention, the silicon oxynitride layer is formed to have an extinction coefficient of from bout 0.5 to about 2.2, more preferably from about 0.90 to about 1.0. In a further aspect of the invention the silicon oxynitride layer is formed to have both a preferred material removal rate in a CMP process and the preferred optical properties such as refractive index and extinction coefficient. Advantageously, the silicon oxynitride layer with the preferred optical properties fulfills the function of reducing undesired reflections in a subsequent trench patterning photolithographic process thereby obviating the necessity of depositing and ARC layer.

Figure 2B:
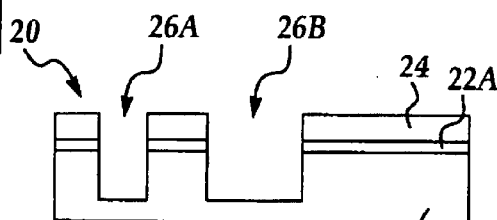

Referring to FIG. 2B, following formation of the silicon oxynitride layer 24, a photoresist layer (not shown) is deposited over the silicon oxynitride layer 24 and photolithographically patterned by a conventional method for anisotropically etching STI trenches around active areas of the semiconductor device. For example, a convention reactive ion etching (RIE) process is used to anisotropically etch through the hard mask layer 24, the PAD oxide 22A, and through a thickness of the substrate 22 to form trench openings e.g., 26A, 26B having a depth of for example, between about 1,500 Angstroms and 6,000 Angstroms. Subsequently, the photoresist (not shown) is removed according to a convention oxygen rich plasma etching process.

Figure 2C:
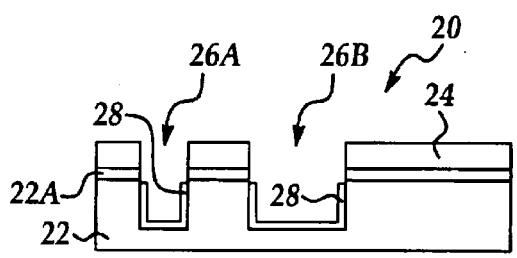

Referring to FIG. 2C, following formation of the STI trenches, 26A, 26B, a silicon oxide trench liner e.g., 28 is thermally grown over the silicon substrate 20 by a conventional thermal oxidation technique to form a conformally grown oxide layer over the silicon substrate of from about 50 to about 500 Angstroms in thickness. A conventional thermal oxidation process, for example, in a dry or wet oxygen containing ambient at a temperature of about 800–1100 C. is a suitable method to row silicon oxide layer 28 on the silicon substrate 22. The oxide trench liner 28 serves to relieve stress and repair etching damage to the silicon substrate.

Figure 2D:
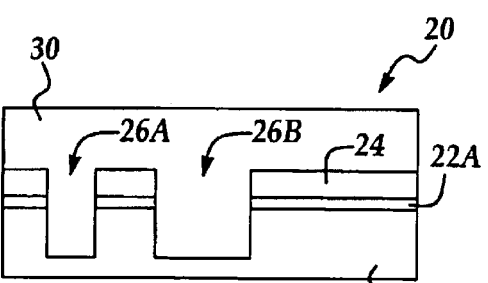

Referring to FIG. 2D, following formation of the oxide trench liner 28 a conventional HDP-CVD process is carried out to form a silicon oxide layer 30, for example, silicon dioxide, also referred to as an STI oxide or HDP oxide, to fill the STI trenches 26A, 26B (oxide trench liner not shown) and cover the silicon oxynitride layer 24. For example, the STI oxide is deposited to a thickness of between about 1000 and about 10,000 Angstroms. Following deposition of the STI oxide layer 30, a conventional annealing process, for example a conventional rapid thermal annealing (RTA) process is carried out. For example, the RTA process is carried out in a nitrogen atmosphere at temperatures from about 800 to about 1100 degrees Centigrade for about 1 minute.

Figure 2E:
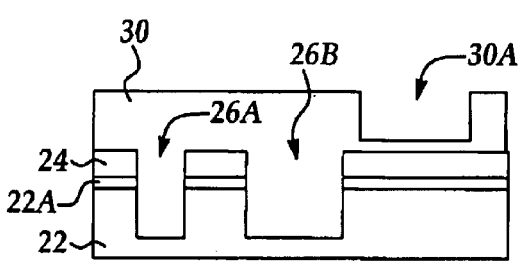

Referring to FIG. 2E, following the RTA process, a conventional reverse mask etch process is carried out to remove a portion of the STI oxide layer 30 overlying the active area, e.g., 30A of the semiconductor device. For example, a portion of the STI oxide (HDP oxide) layer is removed over the active area 30A using a reverse trench mask and etch process as is known in the art. For example, the reverse trench mask can be formed by using by using an opposite type (e.g. positive or negative) of photoresist and exposed through the same optical mask as the trench patterning photolithographic process. By removing a portion of the STI oxide layer 30 over the active area e.g., 30A, the CMP process time is reduced and the CMP polishing results are improved. According to the present invention, the reverse mask etch is an optional procedure.

Figure 2F:
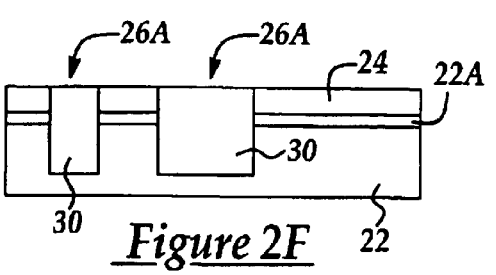

Referring to FIG. 2F, following the reverse mask etch process a conventional CMP process is carried out to remove a remaining portion of the silicon oxide layer overlying the silicon oxynitride layer with the silicon oxynitride layer having the preferred properties according to the invention. As a result, preferential polishing of the STI oxide is avoided to avoid or reduce dishing defects in the STI feature. In another aspect of the invention, preferably a conventional CMP optical detection endpoint system is used for detecting a CMP endpoint in the CMP polishing process. For example, advantageously, the silicon oxynitride layer having the preferred optical properties according to the present invention allows a polishing endpoint to be detected by optical monitoring of the polishing surface by detecting the appearance of the silicon oxynitride layer. Following the CMP process, the hard mask silicon oxynitride layer 24 is removed by a conventional wet chemical etching process.

Figure 3A:
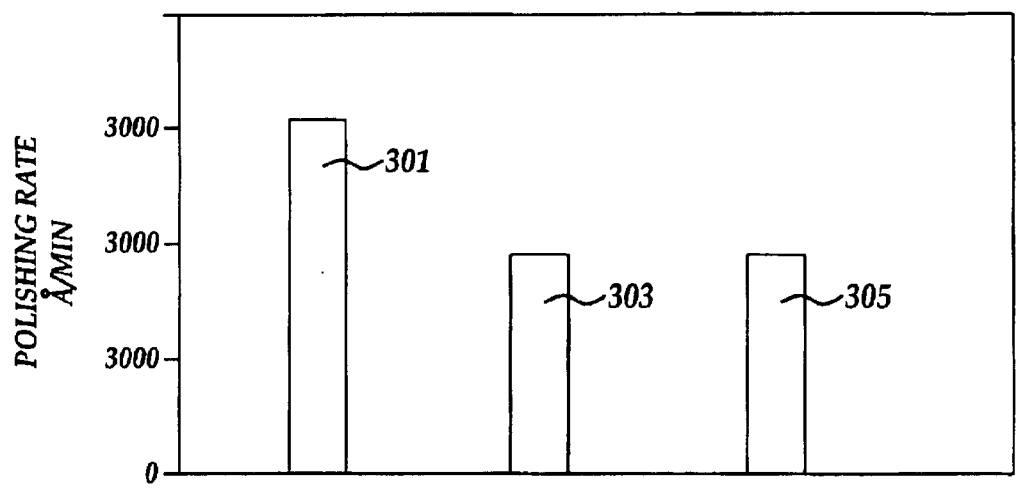
FIGS. 3A–3B are bar graphs showing CMP material removal rates of silicon oxynitride layers compared to a CMP material removal rate of an STI oxide formed according to embodiments of the present invention.

Referring to FIG. 3A, in an exemplary implementation of the present invention, is shown a bar graph representing material removal rates on the vertical axis in a CMP process. For example, bar 301 shows a material removal rate of an as deposited silicon oxynitride layer having an X:Y ratio according to the formula $SiO_xN_y$ of about 1:2. For example, the silicon oxynitride was formed by adjusting relative gas flow rates in a CVD process of $SiH_4$ to $N_2O$ to be about 1:2. Bar 303 shows a material removal rate of the same silicon oxynitride layer following conventional processing steps including a conventional RTA annealing process. In comparison, bar 305 shows a material removal rate of an STI oxide deposited by a conventional HDP-CVD process and following a conventional RTA annealing process. The material removal rates of the silicon oxynitride according to one embodiment of the present invention and the STI oxide are about the equal.

Figure 3B:
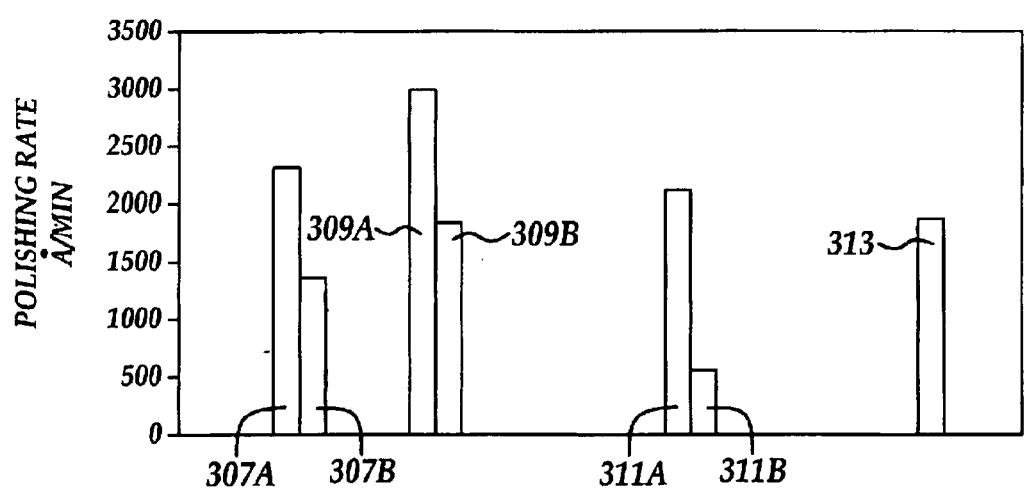

Referring to FIG. 3B, is shown similar data comparing silicon oxynitride material removal rates in a CMP process for both as deposited and annealed conditions following a conventional RTA annealing process, for example, carried out following deposition of the STI oxide. For example, bars 307A and 307B in as deposited and annealed conditions respectively, represent a silicon oxynitride formed to be silicon-rich, for example having a having an X:Y ratio according to the formula $SiO_xN_y$ of about 1:1 formed by adjusting relative gas flow rates in a CVD process of $SiH_4$ to $N_2O$ to be about 1:1. In contrast bars 311A and 311B in as deposited and annealed conditions respectively, represent a silicon oxynitride formed to be Nitrogen-rich, for example having a having an X:Y ratio according to the formula $SiO_xN_y$ of about 1:4 formed by adjusting relative gas flow rates in a CVD process of $SiH_4$ to $N_2O$ to be about 1:4. In the most preferred embodiment, bars 309A and 309B in as deposited and annealed conditions respectively, represent a silicon oxynitride formed to have a having an X:Y ratio according to the formula $SiO_xN_y$ of about 1:2 formed by adjusting relative gas flow rates in a CVD process of $SiH_4$ to $N_2O$ to be about 1:2. In comparison, the material removal rate of the most preferred form of the silicon nitride in the annealed condition has a material removal rate about equal to the STI oxide (silicon oxide) formed by HDPCVD and annealed by the conventional RTA annealing process as shown in bar 313.

According to the present invention, CMP induced defects such as dishing are avoided by providing a silicon oxynitride hardmask layer such that a difference in a material removal rates between silicon oxynitride and an STI oxide is less than a difference in material removal rates between silicon nitride and at least within about plus or minus 50 percent of the STI oxide in a CMP polishing step to define the STI feature. Most preferably, the silicon oxynitride is formed to have a material removal rate about equal to the material removal rate of the STI oxide. In a further advantage, a throughput for STI manufacturing process has been increased by avoiding the step of depositing an ARC layer over the hardmask layer and by avoiding the added processing steps associated with prior art approaches for avoiding CMP induced defects.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for reducing preferential chemical mechanical polishing (CMP) of a silicon oxide filled shallow trench isolation (STI) feature during an STI formation process comprising the steps of:
   a. providing a silicon wafer substrate having a process surface including active areas for forming semiconductor devices;
   b. forming a silicon oxynitride layer over the process surface the silicon oxynitride layer formed such that a silicon oxynitride material removal rate is at least within about plus or minus 50 percent of a material removal rate of the silicon oxide layer formed in step (e) in the CMP process performed in step (f);
   c. photolithographically patterning the silicon oxynitride layer to form an anisotropic etching pattern for forming STI features around the active areas;
   d. anisotropically etching according to the anisotropic etching pattern STI trenches extending into the silicon wafer substrate;
   e. depositing a silicon oxide layer according to an HPD-CVD process to fill the STI trenches, and annealing the silicon oxide layer according to a rapid thermal annealing (RTA) process including a temperature of from about 800 to about 1100 degrees Centigrade; and,
   f. performing a planarization process including at least a CMP process to remove the silicon oxide layer to reveal an upper surface of the silicon oxynitride layer.

2. The method of claim 1 wherein the silicon oxynitride layer is formed to provide a material removal rate being within about plus or minus 25 percent of a material removal rate of the silicon oxide layer material removal rate in the CMP process.

3. The method of claim 1 wherein the silicon oxynitride layer is formed to provide a material removal rate being about equal to a silicon oxide layer material removal rate in the CMP process.

4. The method of claim 1, wherein the silicon oxynitride layer is represented by a formula $SiO_xN_y$ wherein the silicon oxynitride layer is formed to have an x:Y ratio of from about 1:2.

5. The method of claim 1 further comprising the step of thermally growing a silicon oxide liner in the STI trenches prior to the step of depositing a silicon oxide layer.

6. The method of claim 1 wherein the silicon oxynitride is formed having a refractive index from about 1.9 to about 2.2 and an index of refraction from about 0.5 to about 2.2.

7. The method of claim 1, wherein a reverse etch process is carried out to partially remove the silicon oxide layer over the active areas prior to the step of performing a CMP process.

8. The method of claim 7, wherein the step of performing a CMP process includes an optical endpoint detection process for detecting the silicon oxynitride layer.

9. The method of claim 1, wherein the step of performing a CMP process includes an optical endpoint detection process for detecting the silicon oxynitride layer.

10. The method of claim 1 wherein the silicon oxynitride layer is formed such that the silicon oxynitride material removal rate is about equal to the material removal rate of the silicon oxide layer in the CMP process.

11. The method of claim 10 wherein the silicon oxynitride is formed having a refractive index from about 1.9 to about 2.2 and an index of refraction from about 0.5 to about 2.2.

12. The method of claim 1, wherein the silicon oxynitride layer is represented by a formula $SiO_xN_y$ wherein the silicon oxynitride layer is formed to have an x:Y ratio of from about 1:1.5 to about 1:3 by varying a SiH4:N2O gas flow ratio in a CVD process from about 1:1 to about 1:4.

13. The method of claim 1 further comprising the step of thermally growing a silicon oxide liner in the STI trenches prior to the step of depositing a silicon oxide layer.

14. A method for reducing preferential chemical mechanical polishing (CMP) of a silicon oxide filled shallow trench isolation (STI) feature during an STI formation process comprising the steps of:

providing a semiconductor wafer having a process surface including active areas for forming semiconductor devices thereon;

forming a silicon oxynitride layer over the process surface for photolithographically pattering STI trenches around the active areas;

photolithographically patterning STI trenches around the active areas for anisotropic etching;

anisotropically etching the STI trenches extending through the silicon oxynitride layer into the semiconductor wafer;

depositing a silicon oxide layer over the silicon oxynitride layer to include filling the STI trenches, wherein the silicon oxide layer is deposited according to high density plasma chemical vapor deposition (HDPCVD) process and annealed according to a rapid thermal annealing (RTA) treatment; and performing a CMP process to remove the silicon oxide layer overlying the silicon oxynitride layer to reveal an upper surface of the icon oxynitride layer.

* * * * *